(12) United States Patent
Lai et al.

(10) Patent No.: US 9,190,467 B2
(45) Date of Patent: Nov. 17, 2015

(54) SEMICONDUCTOR STRUCTURE AND MANUFACTURING METHOD OF THE SAME

(71) Applicant: Macronix International Co., Ltd., Hsinchu (TW)

(72) Inventors: Erh-Kun Lai, Taichung (TW); Guan-Ru Lee, Kaohsiung (TW); An-Chyi Wei, Hsinchu (TW); Hang-Ting Lue, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/149,873

(22) Filed: Jan. 8, 2014

(65) Prior Publication Data
US 2015/0194481 A1  Jul. 9, 2015

(51) Int. Cl.
*H01L 29/06* (2006.01)
*H01L 27/115* (2006.01)
*H01L 29/78* (2006.01)
*H01L 29/40* (2006.01)

(52) U.S. Cl.
CPC ...... *H01L 29/0603* (2013.01); *H01L 27/11578* (2013.01); *H01L 29/401* (2013.01); *H01L 29/7843* (2013.01)

(58) Field of Classification Search
CPC ... H01L 21/8221; H01L 23/28; H01L 23/291; H01L 27/11578; H01L 27/1158; H01L 29/0603; H01L 29/7842; H01L 29/7843; H01L 29/401
See application file for complete search history.

(56) References Cited

U.S. PATENT DOCUMENTS 8,115,245 B2 *  2/2012  Yoshimizu ........ H01L 27/11578
                                                257/315
2015/0236038 A1 *  8/2015  Pachamuthu ....... H01L 27/1157
                                                257/326

FOREIGN PATENT DOCUMENTS

TW       200636979       10/2006
TW       201212168 A1    3/2012

OTHER PUBLICATIONS

TW Office Action dated Sep. 22, 2015 in corresponding Taiwan application (No. 103100913).

* cited by examiner

*Primary Examiner* — Allison P Bernstein
(74) *Attorney, Agent, or Firm* — McClure, Qualey & Rodack, LLP

(57) ABSTRACT

A semiconductor structure and a manufacturing method of the same are provided. The semiconductor structure includes a substrate, a stacked strip structure, and a tensile material strip. The stacked strip structure is formed vertically on the substrate, the stacked strip structure having compressive stress. The stacked strip structure comprises a plurality of conductive strips and a plurality of insulating strips, and the conductive strips and the insulating strips are interlaced. The tensile material strip is formed on the stacked strip structure, the tensile material strip having tensile stress.

20 Claims, 9 Drawing Sheets

SEMICONDUCTOR STRUCTURE AND MANUFACTURING METHOD OF THE SAME

BACKGROUND

1. Technical Field

The disclosure relates in general to a semiconductor structure and a manufacturing method thereof, and particularly to a semiconductor structure with stable stacked strip structure(s) and a manufacturing method thereof.

2. Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof is in need.

As such, it is desirable to develop a three-dimensional (3D) memory device with larger number of multiple stacked planes to achieve greater storage capacity, a small size, and yet having excellent property and stability.

SUMMARY

The disclosure is directed to a semiconductor structure and a manufacturing method thereof. In the embodiments, a tensile material strip is formed on a stacked strip structure of the semiconductor structure, such that the compressive stress of the stacked strip structure can be compensated by the tensile stress from the tensile material strip. Accordingly, the bending of the stacked strip structure can be reduced, and the stability and the reliability of the semiconductor structure can be improved.

According to an embodiment of the present disclosure, a semiconductor structure is provided. The semiconductor structure includes a substrate, a stacked strip structure, and a tensile material strip. The stacked strip structure is formed vertically on the substrate, the stacked strip structure having compressive stress. The stacked strip structure comprises a plurality of conductive strips and a plurality of insulating strips, and the conductive strips and the insulating strips are interlaced. The tensile material strip is formed on the stacked strip structure, the tensile material strip having tensile stress.

According to another embodiment of the present disclosure, a manufacturing method of a semiconductor structure is provided. The manufacturing method includes the following steps: providing a substrate; forming a stacked strip structure vertically on the substrate, the stacked strip structure having compressive stress; and forming a tensile material strip on the stacked strip structure, the tensile material strip having tensile stress. The stacked strip structure comprises a plurality of conductive strips and a plurality of insulating strips, and the conductive strips and the insulating strips are interlaced.

The above and other embodiments of the disclosure will become better understood with regard to the following detailed description of the non-limiting embodiment(s). The following description is made with reference to the accompanying drawings.

DETAILED DESCRIPTION

In the embodiments of the present disclosure, a semiconductor structure and a method of manufacturing the same are provided. In the embodiments, a tensile material strip is formed on a stacked strip structure of the semiconductor structure, such that the compressive stress of the stacked strip structure can be compensated by the tensile stress from the tensile material strip. Accordingly, the bending of the stacked strip structure can be reduced, and the stability and the reliability of the semiconductor structure can be improved. The following embodiments are for the purpose of elaboration only, not for limiting the scope of protection of the invention. Besides, secondary elements are omitted in the following embodiments to highlight the technical features of the invention.

Figure 1:
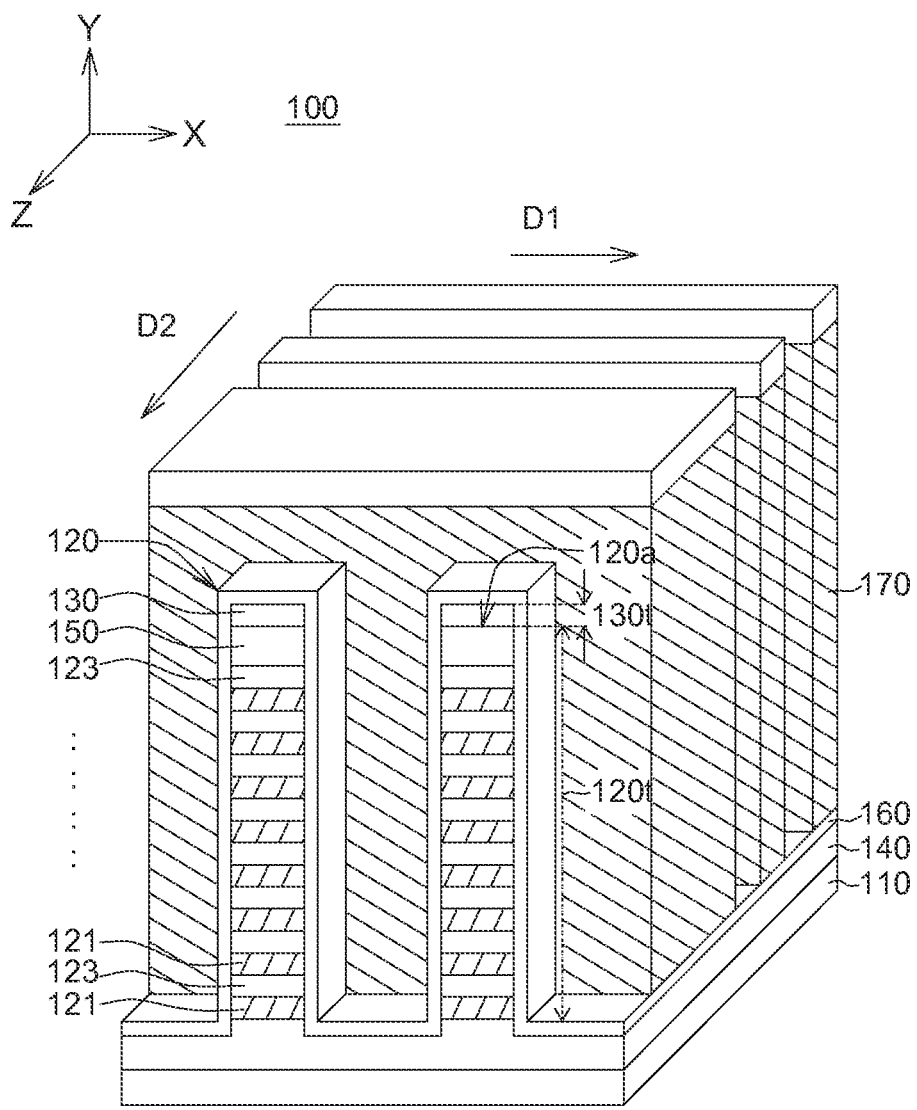
FIG. 1 shows a stereoscopic diagram of a semiconductor structure according to an embodiment of the present disclosure.

Referring to FIG. 1, a stereoscopic diagram of a semiconductor structure 100 according to an embodiment of the present disclosure is shown. The semiconductor structure 100 includes a substrate 110, a stacked strip structure 120, and a tensile material strip 130. As shown in FIG. 1, the stacked strip structure 120 is formed vertically on the substrate 110, and the stacked strip structure 120 has compressive stress. The stacked strip structure 120 includes a plurality of conductive strips 121 and a plurality of insulating strips 123, and the conductive strips 121 and the insulating strips 123 are interlaced. The tensile material strip 130 is formed on the stacked strip structure 120, and the tensile material strip 130 has tensile stress. According to the embodiments of the present disclosure, the tensile material strip 130 is formed on the stacked strip structure 120, such that the compressive stress of the stacked strip structure 120 can be properly compensated by the tensile stress from the tensile material strip 130, and the bending of the stacked strip structure 120 along the width direction can be reduced. Accordingly, the stability of the stacked strip structure 120 is increased, the probability of undesired contact between the stacked strip structure 120 and adjacent elements is reduced, and the reliability of the semiconductor structure 100 as a device can be improved.

As shown in FIG. 1 (please also refer to FIG. 1), in an embodiment, the stacked strip structure 120 may have a length-to-width ratio of about 5-200; in another embodiment, the length-to-width ratio may be about 15-50. For example, when the stacked strip structure 120 has a width W1 of such as 40 nm, accordingly, the length L1 of the stacked strip structure 120 is such as 800-1200 nm. In the embodiments, the conductive strips 121 include polysilicon, and the insulating strips 123 include silicon oxide, both having compressive stress.

In some embodiments, the stacked strip structure 120 may include such as 8-12 pairs of conductive strip 121/insulating strip 123, and each of the conductive strips 121 and the insulating strips 123 has a thickness of about 300 Å. In the present embodiment, as shown in FIG. 1, the stacked strip structure 120 includes 8 conductive strips 121 and 8 insulating strips 123 stacked alternately, and the thickness 120t of the stacked strip structure 120 is about 4800 Å. However, the selections of the quantity and the thickness of the conductive strips 121 and the insulating strips 123 may depend on the conditions applied and are not limited thereto.

In some embodiments, the stacked strip structure 120 may further include a bottom oxide layer 140 and a cap oxide layer 150. The bottom oxide layer is disposed between the lowest conductive strip 121 and the substrate 110, and the cap oxide layer 150 is disposed under the tensile material strip 130. In the present embodiment, the bottom oxide layer 140 and the cap oxide layer 150 are formed by such as silicon oxide. In the embodiment, the thickness of the bottom oxide layer 140 is about 500-2500 Å, depending on the amounts of the conductive strips 121 and the insulating strips 123 in the stacked strip structure 120. In an embodiment, the thickness of the bottom oxide layer 140 is about 1000 Å. In the embodiment, the thickness of the cap oxide layer 150 is about 300-2000 Å, depending on the amounts of the conductive strips 121 and the insulating strips 123 in the stacked strip structure 120. In an embodiment, the thickness of the cap oxide layer 150 is about 1000 Å. However, the selections of the materials and the thicknesses of the bottom oxide layer 140 and the cap oxide layer 150 may depend on the conditions applied and are not limited thereto.

In the embodiment, as shown in FIG. 1, the tensile material strip 130 is formed on the top surface 120a of the stacked strip structure 120. In some embodiments, the tensile material strip 130 comprises a dielectric material, such as a silicon nitride layer or a silicon carbide layer. In an embodiment, the tensile material strip 130 has a thickness of about 100~1000 Å; in another embodiment, the thickness may be about 200~500 Å, depending on the amounts of the conductive strips 121 and the insulating strips 123 in the stacked strip structure 120.

In some embodiments, a ratio of the thickness 130t of the tensile material strip 130 to the thickness 120t of the stacked strip structure 120 is about 1:5~1:100. In other words, as the thickness of the stacked strip structure 120 is increased, the thickness of the tensile material strip 130 should be increased as well, for providing sufficient strain compensation correspondingly. For example, in an embodiment, the thickness of the tensile material strip 130 is about 500 Å, the thickness of the stacked strip structure 120 including 8 conductive strips 121 and 8 insulating strips 123 is about 4800 Å, the thickness of the bottom oxide layer 140 is about 500 Å, the thickness of the cap oxide layer 150 is about 500 Å; accordingly, the ratio of the thickness of the tensile material strip 130 to the thickness of the stacked strip structure 120 is about equal to: 500/(4800+500+500)=1:11. In another embodiment, the thickness of the tensile material strip 130 is about 200 Å, the thickness of the stacked strip structure 120 including 12 conductive strips 121 and 12 insulating strips 123 is about 7200 Å, the thickness of the bottom oxide layer 140 is about 1000 Å, the thickness of the cap oxide layer 150 is about 800 Å; accordingly, the ratio of the thickness of the tensile material strip 130 to the thickness of the stacked strip structure 120 is about equal to: 200/(7200+1000+800)=1:45.

In an embodiment, as shown in FIG. 1 (please also refer to FIG. 5), the length L2 of the tensile material strip 130 is substantially equal to the length L1 of the stacked strip structure 120, and the two sides 130s of the tensile material strip 130 are substantially aligned with the two sides 120s of the stacked strip structure 120. In the present embodiment, as shown in FIG. 1, the tensile material strip 130 covers the top surface 120a of the stacked strip structure 120, and the pattern of the tensile material strip 130 is substantially the same with the pattern of the stacked strip structure 120.

As shown in FIG. 1, the semiconductor structure 100 may further include a dielectric element 160 and a conductive line 170. The dielectric element 160 is formed on the stacked strip structure 120, and the conductive line 170 is formed on the dielectric element 160. The dielectric element 160 may be ONO or ONONO or a tunneling material/trapping material/blacking material layer for storage material of NAND application. The conductive line 170 extends in a direction D1 perpendicular to a direction D2 in which the stacked strip structure 120 extends. In an embodiment, the semiconductor structure 100 is such as a 3D vertical gate memory device, the conductive line 170 is used as a word line, and the stacked strip structure 120 is used as a bit line. In an alternative embodiment, the semiconductor structure 100 is such as a 3D memory device with ultra-thin U-shaped channels, the conductive line 170 is used as a bit line, and the stacked strip structure 120 is used as a word line.

FIGS. 2-8 illustrate a manufacturing method of a semiconductor structure according to an embodiment of the present disclosure.

Referring to FIGS. 2-5, the substrate 110 is provided, the stacked strip structure 120 is formed vertically on the substrate 110, and the tensile material strip 130 is formed on the stacked strip structure 120. In the embodiment, the manufacturing method of the stacked strip structure 120 and the tensile material strip 130 includes such as the following steps.

Figure 2:
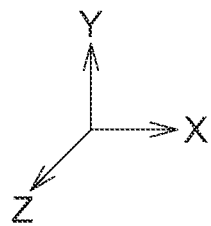
FIGS. 2-8 illustrate a manufacturing method of a semiconductor structure according to an embodiment of the present disclosure.
Figure 2:
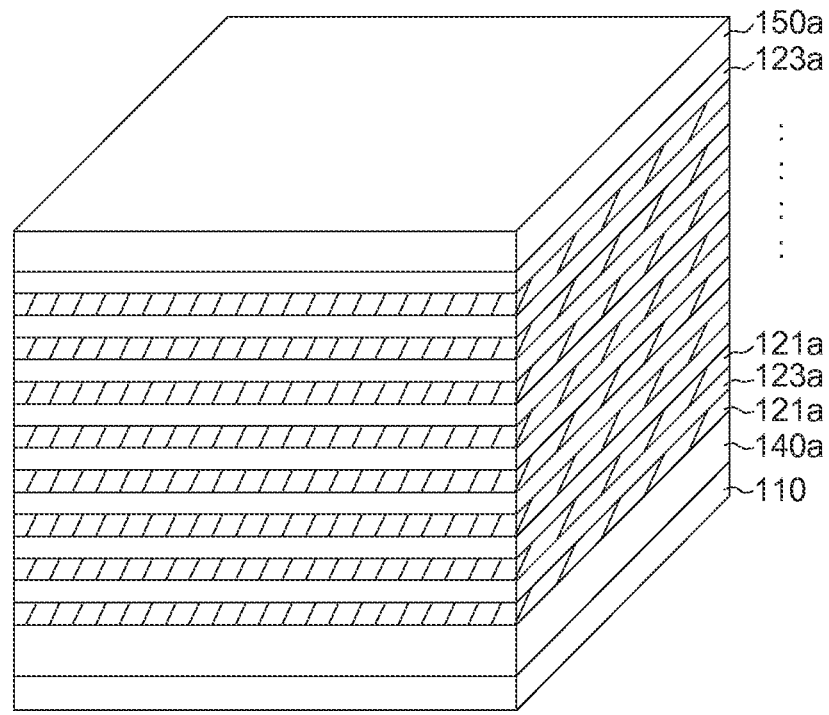

As shown in FIG. 2, a plurality of conductive layers 121a and a plurality of insulating layers 123a are formed on the substrate 110, and the conductive layers 121a and the insulating layers 123a are interlaced. In the embodiment, as shown in FIG. 2, prior to the formation of the conductive layers 121a and the insulating layers 123a, a bottom oxide material layer 140a can be optionally formed on the substrate 110; after the formation of the conductive layers 121a and the insulating layers 123a, a cap oxide material layer 150a can be optionally formed on the conductive layers 121a and the insulating layers 123a.

Figure 3:
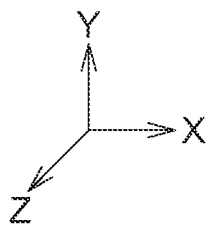
Figure 3:
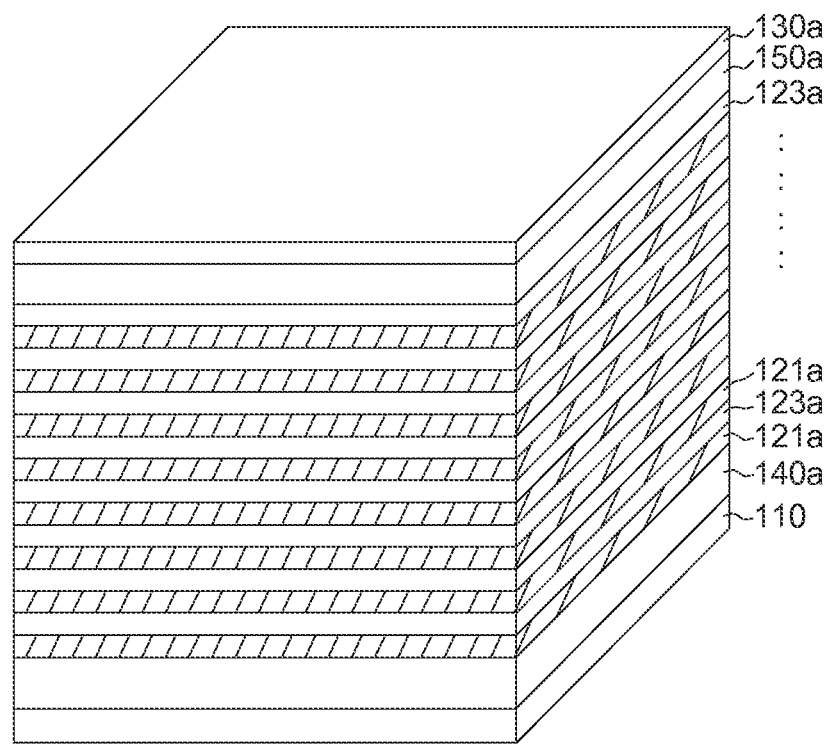

Next, as shown in FIG. 3, a tensile material layer 130a is formed on the conductive layers 121a and the insulating layers 123a. In the present embodiment, the tensile material layer 130a is such as a silicon nitride layer. In the embodiment, the tensile material layer 130a may be any dielectric material layer having tensile stress, for example, a silicon carbide layer. In some embodiments, the tensile material layer 130a may be formed by such as a low-temperature chemical vapor deposition (LPCVD) process or a physical vapor deposition (PVD) process. In an embodiment, in the manufacturing process of forming the tensile material layer 130a by a PVD process, the strength of the tensile stress of the as-formed tensile material layer 130a may be controlled by adjusting certain parameters in the deposition process, such as the ratios of the gas sources. In the embodiment, the tensile material layer 130a may have a thickness of about 100-1000 Å.

Figure 4:
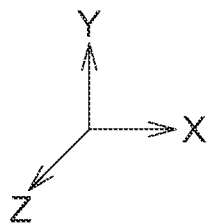
Figure 4:
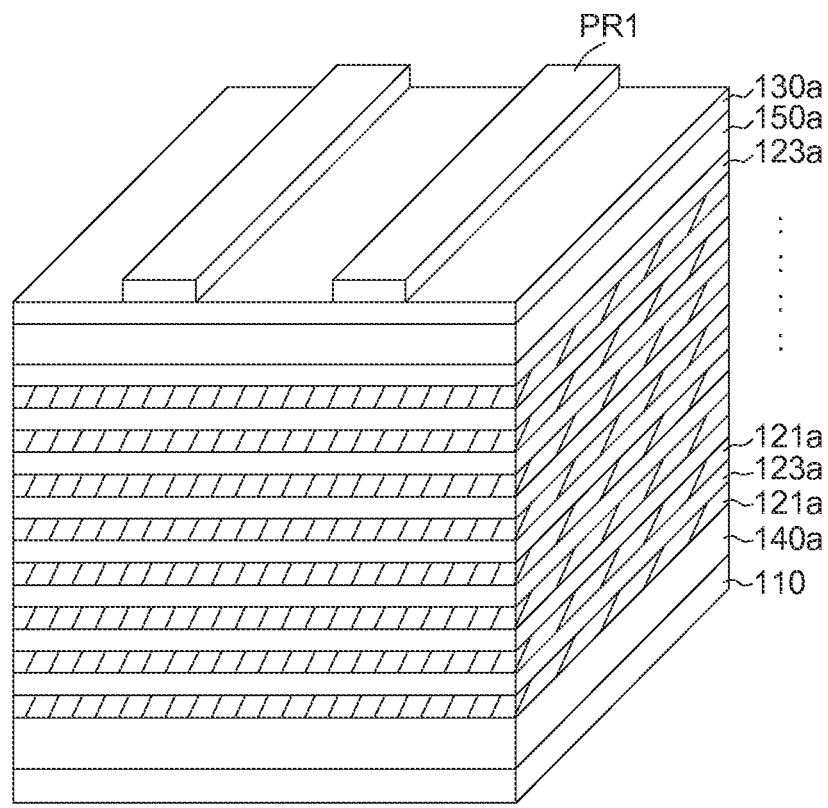

Next, as shown in FIG. 4, a patterned photoresist PR1 is formed on the conductive layers 121a and the insulating layers 123a. The patterned photoresist PR1 has a predetermined pattern of the conductive strips 121 and the insulating strips 123. That is, the patterned photoresist PR1 has the predetermined pattern of the stacked strip structure 120.

Figure 5:
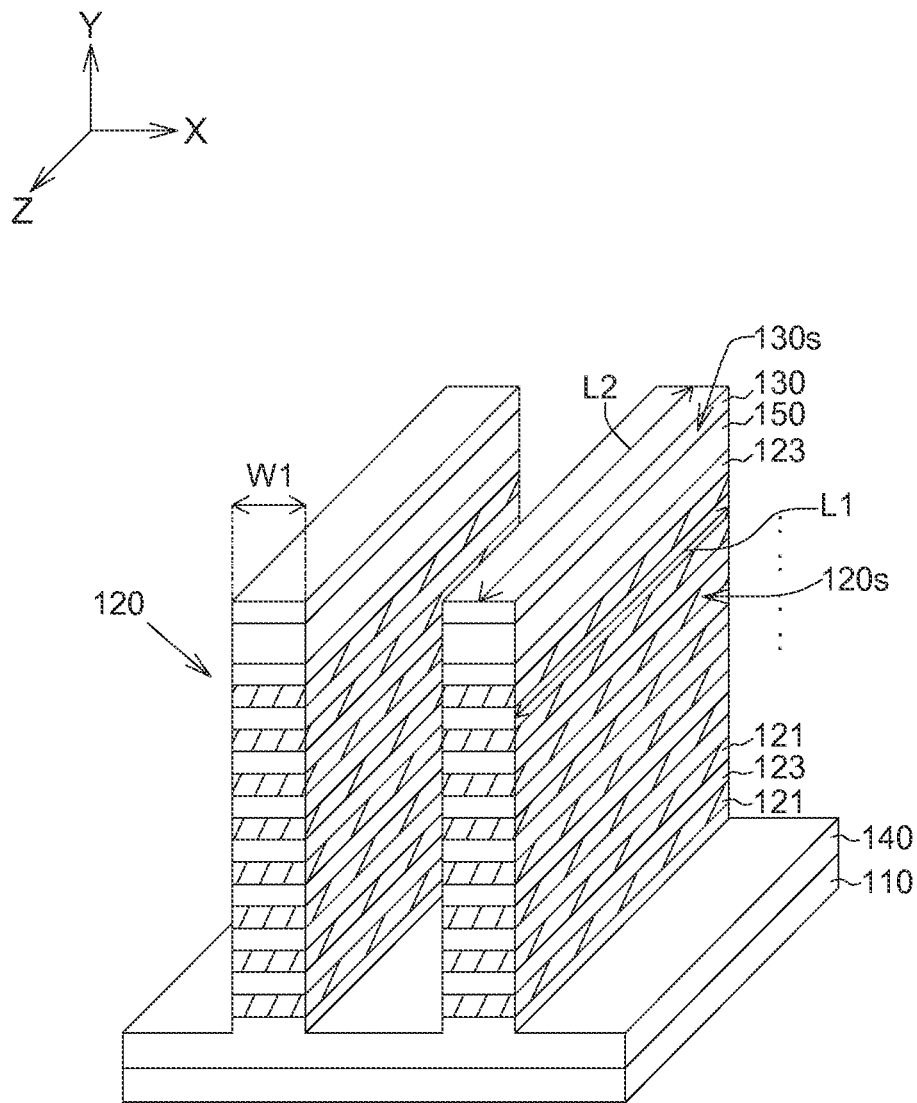

Next, as shown in FIG. 5, the tensile material layer 130a is patterned for forming the tensile material strip 130; the conductive layers 121a and the insulating layers 123a are patterned for forming the conductive strips 121 and the insulating strips 123. In the embodiment, the conductive strips 121 and the insulating strips 123 are formed by, for example, etching the conductive layers 121a and the insulating layers 123a according to the patterned photoresist PR1, i.e. the predetermined pattern of the conductive strips 121 and the insulating strips 123. Likewise, the tensile material strip 130 is formed by such as etching the tensile material layer 130a according to the patterned photoresist PR1.

In an embodiment, the stacked strip structure 120 and the tensile material strip 130 are formed, for example, in the same manufacturing process. In the present embodiment, as shown in FIGS. 2-5, patterning the tensile material layer 130a and patterning the conductive layers 121a and the insulating layers 123a are performed simultaneously.

Figure 6:
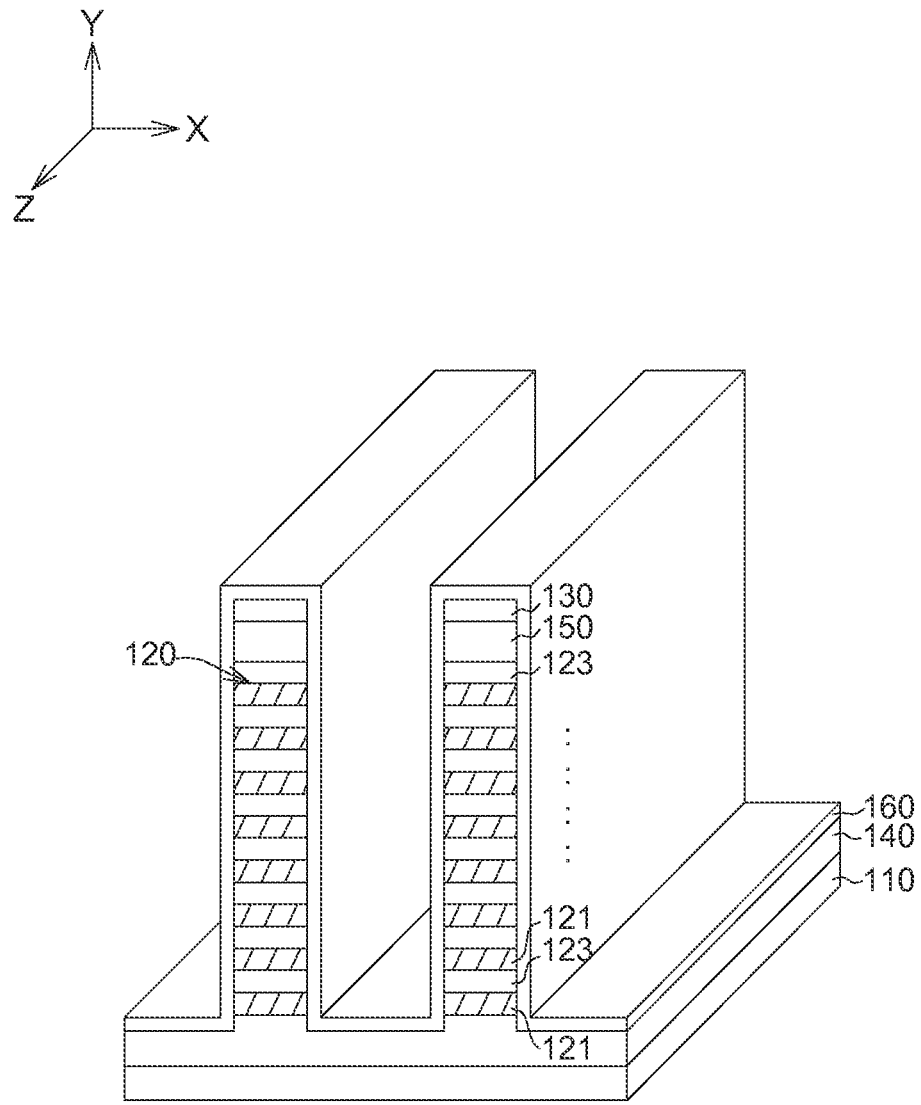

Referring to FIG. 6, the dielectric element 160 is formed on the stacked strip structure 120. In the embodiment, the dielectric element 160 may comprise tunneling material/trapping material/blocking material. For example, the dielectric element 160 may have a multi-layer structure, for example, which may be ONO composite layers, ONONO composite layers, or BE-SONOS composite layers, or comprise, for example, an ONO structure formed by alternately stacking silicon oxide and silicon nitride.

Figure 7:
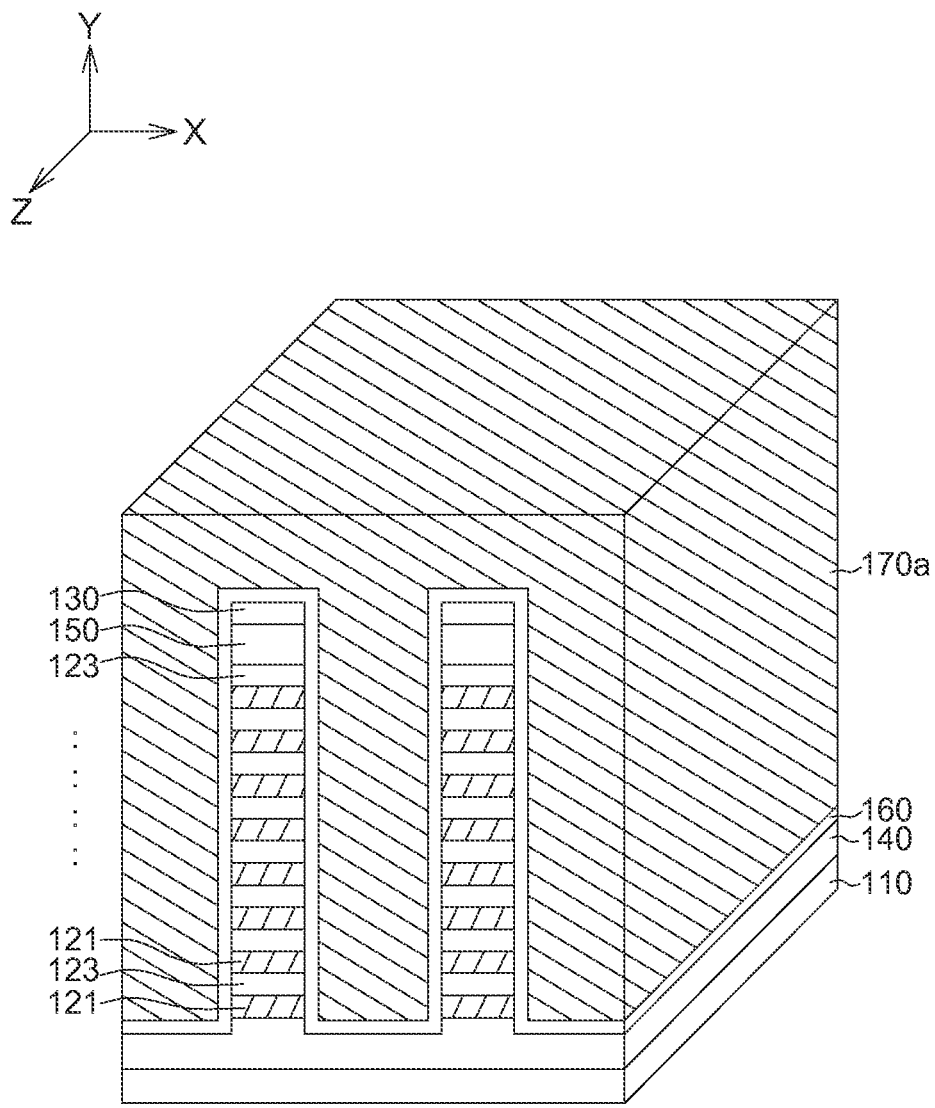
Figure 8:
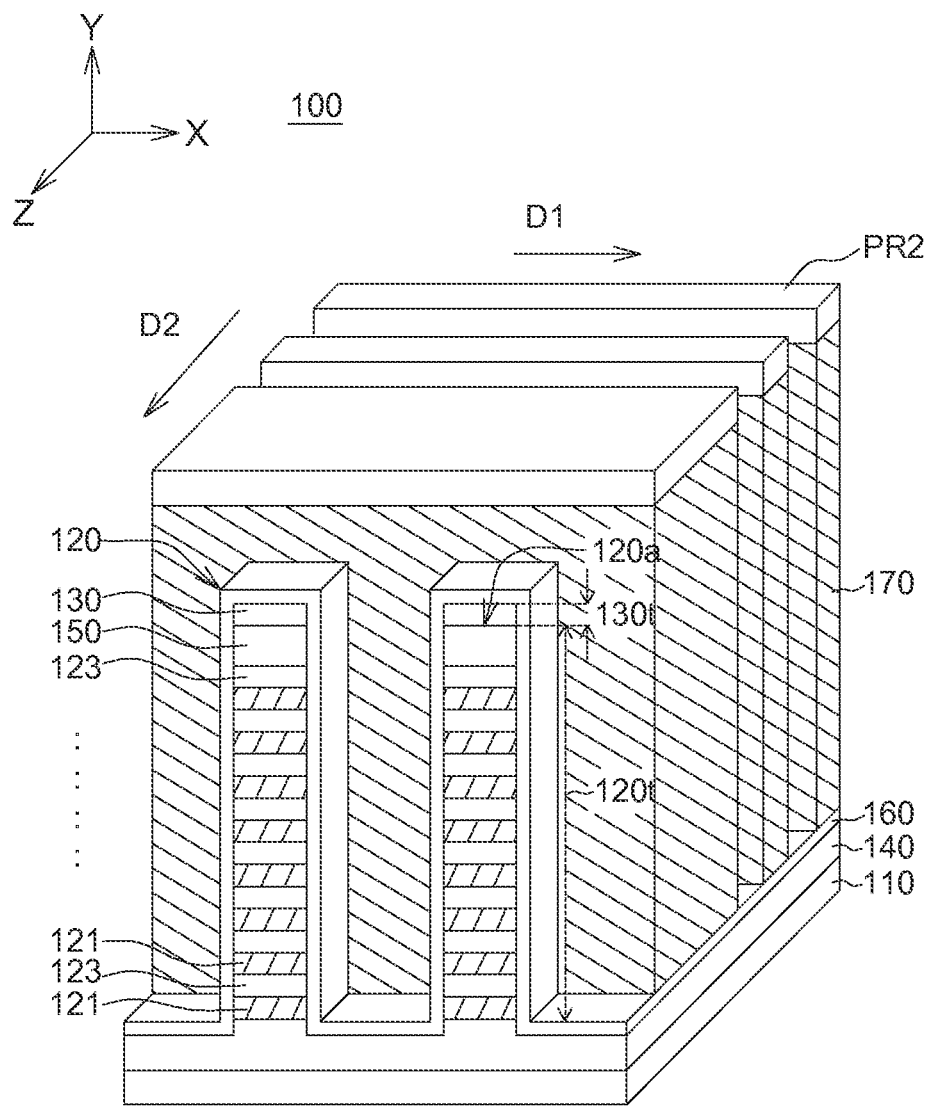

Referring to FIGS. 7-8, the conductive line 170 is formed on the dielectric element 160. In the embodiment, the manufacturing method of the conductive line 170 includes such as the following steps.

As shown in FIG. 7, a conductive material layer 170a is formed on the dielectric element 160.

Next, as shown in FIG. 8, the conductive material layer 170a is patterned for forming the conductive line 170, which extends in a direction D1 perpendicular to a direction D2 in which the stacked strip structure 120 extends. In the embodiment, the conductive material layer 170a is patterned by, for example, etching the conductive material layer 170a according to a patterned photoresist PR2, for forming the conductive line 170. In the present embodiment, the tensile material strip 130 is such as a silicon nitride layer, as such, the tensile material strip 130 can not only provide strain compensation but also function as a hard mask in the etching process of the conductive material layer 170a.

In another embodiment, an insulating layer (not shown) may be formed on the dielectric element 160 followed by the formation of at least a trench in the insulating layer, and then a conductive material is filled in the trench for forming the conductive line 170. In the present embodiment, the tensile material strip 130 is such as a silicon nitride layer, which can function as a hard mask in the planarization process for the insulating layer prior to the formation of the conductive line 170. As such, the semiconductor structure 100 as shown in FIG. 8 is formed.

The embodiments of the present disclosure are further described below. Followings show the semiconductor structures of an embodiment and of a comparative embodiment according to the present disclosure. However, it should be noted that the following examples are exemplifications rather than limitations to the disclosure.

Figure 9A:
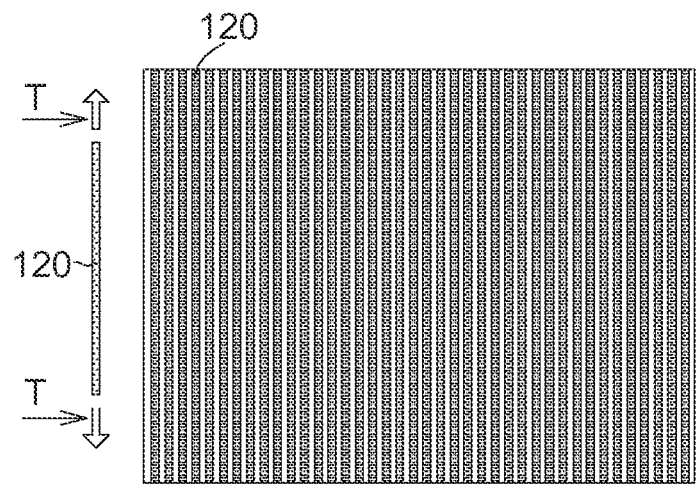
FIGS. 9A-9B show schematic diagrams of SEM figures of the semiconductor structures of an embodiment and a comparative embodiment according to the present disclosure.
Figure 9B:
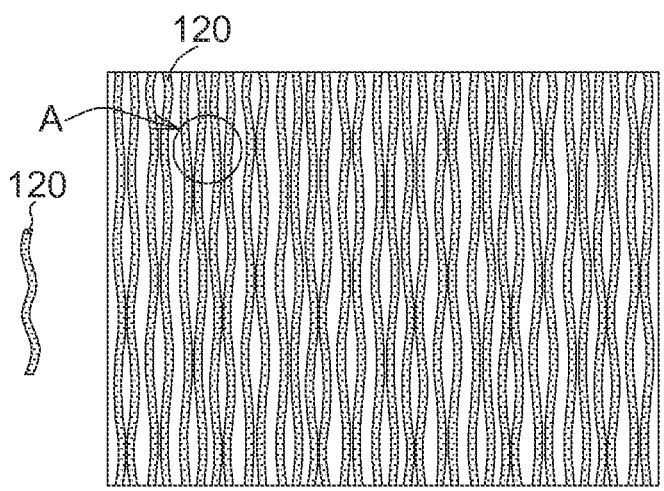

FIGS. 9A-9B show schematic diagrams of SEM figures of the semiconductor structures of an embodiment and a comparative embodiment according to the present disclosure. In the embodiment, the stacked strip structures 120 of the semiconductor structure include the conductive strips 121 and the insulating strips 123 with tensile material strips 130 formed thereon. In the comparative embodiment, the stacked strip structures include the conductive strips 121 and the insulating strips 123 without any tensile material strips 130 formed thereon. The conductive strips 121 are such as polysilicon with compressive stress of −200 MPa, the insulating strips 123 are such as silicon oxide with compressive stress of −300 MPa, and the tensile material strips 130 are such as silicon nitride with tensile stress of 1000 MPa.

As shown in FIGS. 9A and 9B, in the embodiment, the tensile material strip 130, having tensile stress T along two opposite directions along the length direction of the stacked strip structure 120, of the semiconductor structure can provide effective strain compensation to the whole structure; therefore, the stacked strip structure 120 does not bend or deform. In contrast, in the comparative embodiment, the semiconductor structure does not include any tensile material strip; therefore, the compressive stress of the stacked strip structure 120 cannot be compensated. As shown in region A of and the cartoon figure in FIG. 9B, the stacked strip structure 120 bends and deforms, particularly along the width direction, resulting in undesired contact between adjacent stacked strip structures 120.

As such, according to the embodiments of the present disclosure, the tensile material strip of the semiconductor structure is formed on the stacked strip structure, such that the compressive stress of the stacked strip structure can be compensated by the tensile stress from the tensile material strip. Accordingly, the bending of the stacked strip structure along the width direction can be largely reduced, the stacked strip structure may have a superior straight bit line (or word line) profile, the stability of the semiconductor structure is increased, and the reliability of the semiconductor structure as a device is improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate;
   a stacked strip structure formed vertically on the substrate, the stacked strip structure having compressive stress and comprising:
   a plurality of conductive strips; and
   a plurality of insulating strips, the conductive strips and the insulating strips being interlaced; and
   a tensile material strip formed on the stacked strip structure, the tensile material strip having tensile stress.

2. The semiconductor structure according to claim 1, wherein the stacked strip structure has a length-to-width ratio of about 5-200.

3. The semiconductor structure according to claim 1, wherein the tensile material strip has a length substantially equal to that of the stacked strip structure.

4. The semiconductor structure according to claim 1, wherein the tensile material strip has two sides substantially aligned with two sides of the stacked strip structure.

5. The semiconductor structure according to claim 1, wherein the tensile material strip comprises a silicon nitride layer or a silicon carbide layer.

6. The semiconductor structure according to claim 1, wherein a ratio of the thickness of the tensile material strip to the thickness of the stacked strip structure is about 1:5-1:100.

7. The semiconductor structure according to claim 1, wherein the tensile material strip has a thickness of about 100-1000 Å.

8. The semiconductor structure according to claim 1, wherein the conductive strips comprise polysilicon, and the insulating strips comprise silicon oxide.

9. The semiconductor structure according to claim 1, further comprising:
   a dielectric element formed on the stacked strip structure.

10. The semiconductor structure according to claim 9, further comprising:
   a conductive line formed on the dielectric element, wherein the conductive line extends in a direction perpendicular to a direction in which the stacked strip structure extends.

11. A manufacturing method of a semiconductor structure, comprising:
   providing a substrate;
   forming a stacked strip structure vertically on the substrate, the stacked strip structure having compressive stress and comprising:
   a plurality of conductive strips; and
   a plurality of insulating strips, the conductive strips and the insulating strips being interlaced; and
   forming a tensile material strip on the stacked strip structure, the tensile material strip having tensile stress.

12. The manufacturing method of the semiconductor structure according to claim 11, wherein the stacked strip structure and the tensile material strip are formed in the same manufacturing process.

13. The manufacturing method of the semiconductor structure according to claim 11, wherein forming the conductive strips and forming the insulating strips comprise:
   forming a plurality of conductive layers and a plurality of insulating layers, the conductive layers and the insulating layers being interlaced; and
   patterning the conductive layers and the insulating layers for forming the conductive strips and the insulating strips.

14. The manufacturing method of the semiconductor structure according to claim 13, wherein forming the tensile material strip comprises:
   forming a tensile material layer on the conductive layers and the insulating layers; and
   patterning the tensile material layer according to a predetermined pattern of the conductive strips and the insulating strips for forming the tensile material strip.

15. The manufacturing method of the semiconductor structure according to claim 14, wherein patterning the tensile material layer and patterning the conductive layers and the insulating layers are performed simultaneously.

16. The manufacturing method of the semiconductor structure according to claim 11, wherein the tensile material strip is formed by a PVD process.

17. The manufacturing method of the semiconductor structure according to claim 11, wherein a ratio of the thickness of the tensile material strip to the thickness of the stacked strip structure is about 1:5-1:100.

18. The manufacturing method of the semiconductor structure according to claim 11, wherein the tensile material strip has a thickness of about 100-1000 Å.

19. The manufacturing method of the semiconductor structure according to claim 11, further comprising:
   forming a dielectric element on the stacked strip structure.

20. The manufacturing method of the semiconductor structure according to claim 19, further comprising:
   forming a conductive line on the dielectric element, wherein the conductive line extends in a direction perpendicular to a direction in which the stacked strip structure extends.

* * * * *